(12) United States Patent  
Pierson et al.

(10) Patent No.: US 9,338,931 B2  
(45) Date of Patent: May 10, 2016

(54) ELECTRONIC CARD, AN ELECTRONIC DEVICE INCLUDING SUCH A CARD, AND A METHOD OF PROTECTING AN ELECTRONICS CARD

(75) Inventors: Jérôme Pierson, Paris (FR); Philippe Elie, Paris (FR)

(73) Assignee: SAGEM DEFENSE SECURITE, Paris (FR)

( * ) Notice: Subject to any disclaimer, the term of this patent is extended or adjusted under 35 U.S.C. 154(b) by 190 days.

(21) Appl. No.: 13/877,295

(22) PCT Filed: Oct. 19, 2011

(86) PCT No.: PCT/EP2011/068246  
§ 371 (c)(1),  
(2), (4) Date: Apr. 1, 2013

(87) PCT Pub. No.: WO2012/055733  
PCT Pub. Date: May 3, 2012

(65) Prior Publication Data  
US 2013/0201643 A1    Aug. 8, 2013

Related U.S. Application Data

(60) Provisional application No. 61/434,672, filed on Jan. 20, 2011.

(30) Foreign Application Priority Data

Oct. 26, 2010   (FR) ..................................... 10 58777

(51) Int. Cl.  
*H05K 9/00* (2006.01)  
*H05K 1/02* (2006.01)  
*H05K 1/16* (2006.01)

(52) U.S. Cl.  
CPC ............ *H05K 9/0066* (2013.01); *H05K 1/0224* (2013.01); *H05K 1/0257* (2013.01);  
(Continued)

(58) Field of Classification Search  
CPC ............. H01L 23/3735; H01R 23/688; H01R 13/6658; H01R 9/091; H01R 13/6466; H01R 13/65807; H01R 13/6581; H01R 13/6587; H01R 13/743; H01R 24/50; H01R 4/2429; H01R 9/034; B32B 2457/08; H01F 27/365; H01F 2017/0066; H01F 27/362; H05K 1/144; H05K 2201/0187; H05K 2201/043; H05K 2201/0715; H05K 2201/09036; H05K 1/0218; H05K 1/0219; H05K 1/0298; H05K 1/16; H05K 2203/1572; H05K 3/022; H05K 9/0037; H01P 3/088  
USPC ......... 361/816, 818, 800, 803, 796, 1, 39–41, 361/117–138, 748, 719, 753, 737; 174/250, 174/257, 51, 258–261, 350–354  
See application file for complete search history.

(56) References Cited

U.S. PATENT DOCUMENTS 4,855,537 A * 8/1989 Nakai et al. .................... 174/250  
5,003,273 A * 3/1991 Oppenberg ...................... 333/1  
(Continued)

FOREIGN PATENT DOCUMENTS

EP    1 935 784 A2   6/2008  
GB    1 502 977 A    3/1978

*Primary Examiner* — Robert J Hoffberg  
*Assistant Examiner* — Michael Matey  
(74) *Attorney, Agent, or Firm* — Muncy, Geissler, Olds & Lowe, P.C.

(57) ABSTRACT

An electronics card comprising a stack of printed circuit layers, each comprising an electrically insulating support having at least one conductive track extending thereon, and two electromagnetic shields extending respectively over a top face and over a bottom face of the stack, each shield comprising a grid and a plate that are superposed and electrically conductive, each extending over an electrically insulating support, and the conductive tracks being obtained by solid copper type etching. The invention also provides a device including such a card, and a method of protecting such a card of such a device against a lightning strike and against electromagnetic radiation.

7 Claims, 1 Drawing Sheet

Figure 1:
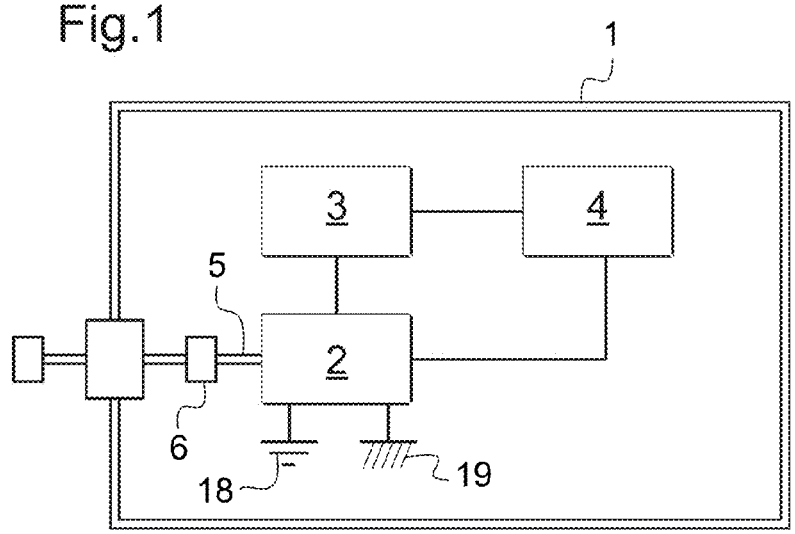

(52) U.S. Cl.
CPC ............ *H05K1/0298* (2013.01); *H05K 9/0064* (2013.01); *H05K 1/162* (2013.01); *H05K 2201/09681* (2013.01)

(56) References Cited

U.S. PATENT DOCUMENTS

| | | | | |
|---|---|---|---|---|
| 5,334,800 A | * | 8/1994 | Kenney | 174/250 |
| 5,360,949 A | * | 11/1994 | Duxbury | 174/250 |
| 5,675,299 A | * | 10/1997 | Suski | 333/1 |
| 5,682,124 A | | 10/1997 | Suski | |
| 5,929,375 A | * | 7/1999 | Glovatsky | H05K 1/0207 174/252 |
| 7,869,181 B2 | * | 1/2011 | Le | 361/218 |
| 2005/0258522 A1 | * | 11/2005 | En et al. | 257/670 |
| 2009/0173533 A1 | | 7/2009 | Brock et al. | |
| 2010/0270059 A1 | * | 10/2010 | Takeuchi et al. | 174/254 |

* cited by examiner

ELECTRONIC CARD, AN ELECTRONIC DEVICE INCLUDING SUCH A CARD, AND A METHOD OF PROTECTING AN ELECTRONICS CARD

The present invention relates to an electronics card and to an electronic device suitable for use in particular in an aircraft.

An electronics card comprises a stack of printed circuit layers, each comprising an electrically insulating support having at least one conductive track extending thereon.

Electronic equipment on board aircraft is subjected to various types of constraint.

These constraints include lightning and electromagnetic radiation.

Concerning lightning, when airplanes have a metal fuselage, the fuselage behaves like a Faraday cage protecting equipment contained inside the fuselage against direct effects but not against indirect effects which, by coupling with inductive loops, produce currents in the interconnections with the equipment. The mechanical ground of the aviation equipment is then connected to the mechanical ground of the aircraft. It is known to use a lightning arrester element for protecting such electronic equipment.

However, the fuselages of modern aircraft incorporate an increasing quantity of materials that are not sufficiently electrically conductive to enable the fuselage to constitute an efficient Faraday cage, such that it is necessary for on-board electronic equipment to be capable of withstanding stresses due to residual voltages and currents higher and higher.

The solution conventionally used for protecting on-board electronic equipment in such an aircraft is to isolate the equipment electrically from the on-board network (the word "network" is used in a large meaning and encompasses all the interconnection lines). The electrical ground of the equipment and all the interconnection lines are then isolated from the mechanical ground of the aircraft. In these conditions, the inductive loop which contributed to the creation of the inductive currents is opened. The current tends to zero and high voltages are created on the whole of the interconnection lines linked to the equipment (common mode voltage).

Concerning electromagnetic radiation, on-board electronic equipment must emit no more than a limited quantity of radiation (in accordance with norms or internal stresses of the equipment) and its operation must not be disturbed by such radiation emitted by other equipment or internal electronic card or resulting from external electromagnetic fields.

Electronics cards are generally provided with electrically conductive ground planes (0V potential for secondary supplying circuit) that are connected to the mechanical ground of the device (by direct lines or by capacitor) in order to discharge any electrical charge (high frequency current) produced in the cards and the electromagnetic radiation to which they are subjected.

In order to maintain protection against indirect lightning strikes on the cards that are fitted with such ground planes, it is nevertheless necessary to have recourse to dedicated protective circuits based on components of the surge-suppressing peak-clipping diode type. Unfortunately, such circuits are bulky and expensive.

An object of the invention is to provide means for protecting on-board electronic equipment against lightning and against electromagnetic radiation.

In the state of the art, the electrically conductive around planes are connected to the mechanical ground of the device such that, in the event of a lightning strike, the input/output connection of the card is subjected to an extremely high voltage that requires a protection circuit that is constituted by high-performance components.

The invention seeks to create a voltage divider in the electronics card such that, in the event of a lightning strike, the voltage to which the input/output connection is subjected is reduced significantly, without spoiling the reliability of the card.

To this end, the invention provides for reducing the capacitance of the capacitor formed by the electromagnetic shields for protecting the card against external electromagnetic radiation and for creating stray capacitances within the card.

Thus, according to the invention, the electronics card comprises a stack of printed circuit layers, each comprising an electrically insulating support on which at least one conductive track extends, and two electromagnetic shields extending respectively over a top face and over a bottom face of the stack. The proximity of a shield enables the emitted radiation level to be reduced. Each shield comprises a grid and a plate that are superposed and electrically conductive, e.g. extending over an electrically insulating support, and the conductive tracks are obtained by etching of the solid copper type.

The grids are designed to be connected to the mechanical ground of the device in which the card is mounted in order to form a shield against external electromagnetic radiation, and the plates are designed to be connected to the electrical ground of the device in order to form a shield, against internal electromagnetic radiation. The use of grids makes it possible to define the conductive area of the electromagnetic shield formed by the grids in such a manner as to reduce the capacitance of the capacitor they constitute.

Making the conductive tracks by solid copper etching or by drill-bit routing serves to increase the stray capacitances that are internal to the card.

As a result, in the event of a lightning strike, the voltage divider constituted by the plane capacitor formed by the grids and the stray capacitances formed between the printed circuit layers reduces the voltage to which the printed circuits and the input/output connection of the card are subjected (at least on a part of the frequency spectrum) so that lower-performance components can be used for constituting the protection circuit.

This arrangement does not lead to any degradation in the reliability of the card.

Preferably, the grid extends between the support of the plate and the stack.

Thus, the external electromagnetic radiation returned by the grids is eliminated by the plates that drain the electric charge created by said radiation. The card therefore emits less electromagnetic radiation that might disturb the surrounding equipment.

The invention also provides a device including such a card.

Finally, the invention provides a method of protecting an electronics card of such a device.

The invention thus provides a method of protecting an electronics card of an electronic device against lightning strikes and against electromagnetic radiation, the electronics card comprising a stack of printed circuit layers, each comprising an electrically insulating support having at least one conductive track extending thereon, two electromagnetic shields extending respectively over a top face and over a bottom face of the stack, and at least a portion of each shield being connected to a mechanical ground of the device, the method comprising the steps of arranging said shield portions to form a main capacitance and arranging the printed circuits of the printed circuit layers to form stray capacitances in such a manner that the main capacitance and the stray capacitances form a voltage divider to limit the voltage to which the printed circuits are subjected in the event of a lightning strike.

Other characteristics and advantages of invention appear on reading the following description of a particular and non-limiting embodiment of the invention.

Figure 2:
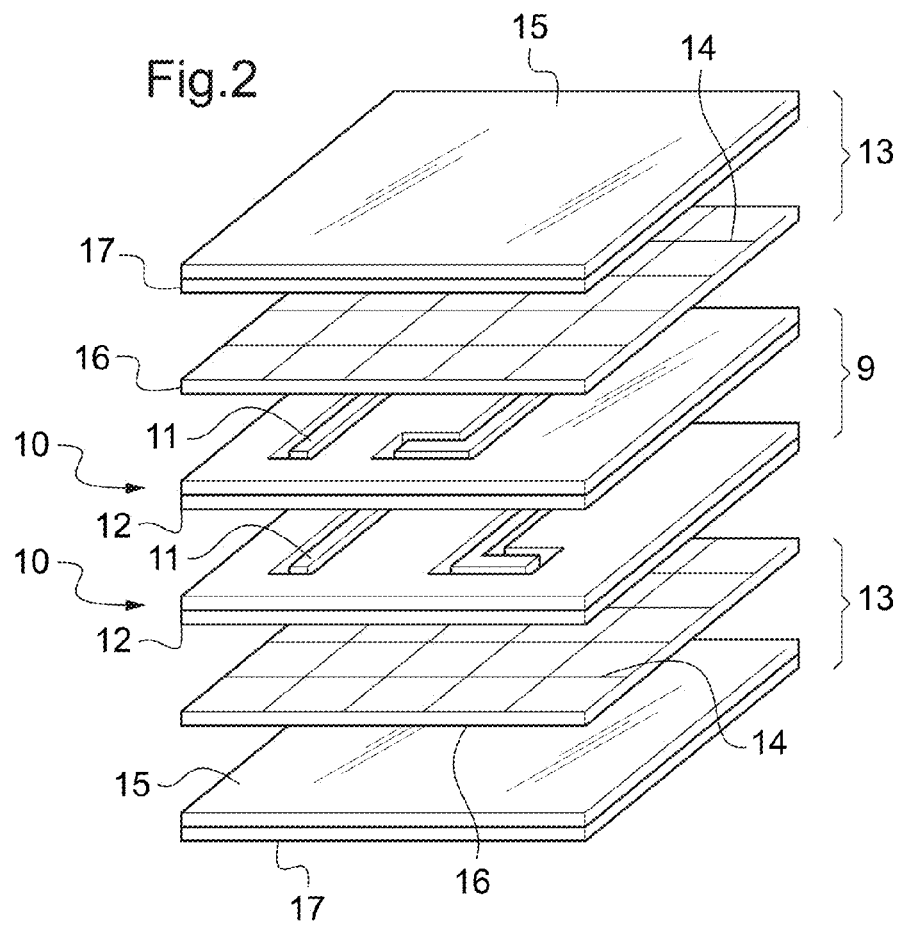

Reference is made to the accompanying drawings, in which:

FIG. 1 is a diagrammatic view of a circuit of an electronic device in accordance with the invention; and FIG. 2 is an exploded perspective view of a card in accordance with the invention.

The invention is described herein in application to an electronic device on board an aircraft and intended, for example, to constitute an auxiliary module for assisting in the piloting of the aircraft in the event of failure of the main piloting unit. This device is itself known and it is not described in detail herein.

The device comprises a housing 1 containing electronics cards 2, 3, and 4. The electronics card 2 is an input/output card provided with a connection 5 with the outside. A conventional anti-lightning component 6 is mounted on the connection 5. The electronics card 2 is connected to the other cards 3 and 4. The device is isolated: the electrical ground of the device is isolated from the electrical ground of the aircraft.

The electronics card 2 comprises a stack 9 of layers, given overall reference 10, the printed circuit including an electrically insulating support 12 on which there extends at least one conductive track 11. The conductive tracks 11 are obtained by etching of the solid copper type or of the drill-bit routing type. It is recalled that with this type of etching, most of the support remains covered in copper, the tracks merely being defined by etching in the copper covering the support.

The electronics card 2 also comprises two electromagnetic shields, given overall reference 13, and extending respectively over a top face and over a bottom face of the stack 9.

Each electromagnetic shield 13 comprises a grid 14 and a plate 16 that are superposed and electrically conductive, and each of which extends over a support 15, 17 that is electrically insulating.

The grid 14 and its support 16 extend between the support 17 of the plate 15 and the stack 9. In this example, the grid 14 has tracks that are about 1 millimeters (mm) wide and that are spaced apart from one another by about 5 mm.

The grid 14 is electrically connected to the mechanical around 18 of the device and the plate 15 is electrically connected to the electrical ground 19 of the device.

The insulating supports are of structure that is conventional in the field of electronics cards.

The components of the card are not shown. The input of each component that is sensitive to excess voltages, e.g. the grid of each MOSFET type transistor, is fitted with an anti-lightning component, which is capable in this example of withstanding 200 volts (V) and which is connected to the electrical ground.

The device and the electronics card 2 thus implement a method of providing protection against lightning strikes and against electromagnetic radiation. The method comprises the steps of arranging the grids 14 of the shields 13 to form a main capacitance and arranging the printed circuits 11 of the printed circuit layers 10 to form the stray capacitances in such a manner that the main capacitance and the stray capacitances form a voltage-divider circuit to limit the voltage to which the printed circuits and the anti-lightning component 6 are subjected in the event of a lightning strike.

The dimensioning of the grids and the geometry of the printed circuits enable the main capacitance and the stray capacitances to be defined, and thus enable the value of the divisor of the voltage divider circuit to be defined.

Naturally, the invention is not limited to the embodiment described, but covers any variant coming within the ambit of the invention as defined by the claims.

In particular, the positions of the grids and of the plates may be inverted.

The grids may have dimensions other than those indicated.

The invention claimed is:

1. An electronics card (2) comprising a stack (9) of printed circuit layers (10), each comprising an electrically insulating support (12) having at least one conductive track (11) extending thereon, and two electromagnetic shields (13) extending respectively over a top face and over a bottom face of the stack, the card being characterized in that each shield comprises a grid (14) and a plate (16) that are superposed and electrically conductive, each extending over an electrically insulating support (15, 17), and the conductive tracks are obtained by solid copper type etching.

2. A card according to claim 1, wherein the grid (14) extends between the support (17) of the plate (16) and the stack (9).

3. A card according to claim 1, wherein the grid (14) has tracks that are about 1 mm wide and that are spaced apart from one another by about 5 mm.

4. An electronic device comprising a housing (1) containing at least one electronics card (2) comprising a stack (9) of printed circuit layers, each comprising an electrically insulating support (12) having at least one conductive track (11) extending thereon, and two electromagnetic shields (13) extending respectively over a top face and over a bottom face of the stack, the card being provided with an electrical connection (5) with the outside of the housing, and with at least one anti-lightning component (6), the device being characterized in that each shield comprises a grid (14) and a plate (16) that are superposed and electrically conductive, the grid and the plate being provided with means for electrically connecting them respectively to a mechanical ground (19) and to an electrical ground (18) of the device, and the conductive tracks are obtained by solid copper type etching.

5. A device according to claim 4, wherein the grid (14) extends between the support (17) of the plate (16) and the stack (9).

6. A device according to claim 4, wherein the grid (14) has tracks that are about 1 mm wide and that are spaced apart from one another by about 5 mm.

7. A method of protecting an electronics card (2) of an electronic device against lightning strikes and against electromagnetic radiation, the electronics card (2) comprising:
  a stack (9) of printed circuit layers (10), each comprising an electrically insulating support (12) having at least one conductive track (11) extending thereon, the conductive tracks being obtained by solid copper type etching,
  two electromagnetic shields (13) extending respectively over a top face and over a bottom face of the stack, each shield comprising a grid (14) and a plate (16) that are superposed and electrically conductive, each extending over an electrically insulating support (15, 17), and at least a portion of each shield being connected to a mechanical ground of the device,
  the method comprising the steps of arranging said shield portions to form a main capacitance and arranging the printed circuits of the printed circuit layers (10) to form stray capacitances in such a manner that the main capacitance and the stray capacitances form a voltage divider to limit the voltage to which the printed circuits are subjected in the event of a lightning strike.

* * * * *